(12) United States Patent
Ishihara et al.

(10) Patent No.: US 8,118,591 B2
(45) Date of Patent: Feb. 21, 2012

(54) HEAT SHIELD PLATE FOR SUBSTRATE ANNEALING APPARATUS

(75) Inventors: Terumasa Ishihara, Tokyo (JP); Takaharu Hashimoto, Tokyo (JP); Masayuki Mizuno, Tokyo (JP); Masaru Morita, Tokyo (JP)

(73) Assignee: IHI Corporation, Tokyo (JP)

( * ) Notice: Subject to any disclaimer, the term of this patent is extended or adjusted under 35 U.S.C. 154(b) by 774 days.

(21) Appl. No.: 12/280,811

(22) PCT Filed: Mar. 15, 2007

(86) PCT No.: PCT/JP2007/055236
§ 371 (c)(1),
(2), (4) Date: Aug. 27, 2008

(87) PCT Pub. No.: WO2007/105798
PCT Pub. Date: Sep. 20, 2007

(65) Prior Publication Data
US 2009/0029308 A1    Jan. 29, 2009

(30) Foreign Application Priority Data
Mar. 16, 2006   (JP) .................. 2006/072201

(51) Int. Cl.
*F27D 5/00*   (2006.01)
(52) U.S. Cl. ...................... 432/258; 432/230
(58) Field of Classification Search ........... 432/258, 432/253, 259, 230, 65, 83
See application file for complete search history.

(56) References Cited

U.S. PATENT DOCUMENTS

| 4,481,406 | A | * | 11/1984 | Muka | 219/411 |
| 5,414,244 | A | * | 5/1995 | Imahashi | 219/497 |
| 5,830,277 | A | * | 11/1998 | Johnsgard et al. | 118/725 |
| 5,837,555 | A | * | 11/1998 | Kaltenbrunner et al. | 438/796 |
| 5,960,158 | A | * | 9/1999 | Gat et al. | 392/416 |
| 6,450,805 | B1 | * | 9/2002 | Oda et al. | 432/247 |
| 6,686,048 | B1 | * | 2/2004 | Arimoto et al. | 428/408 |
| 2010/0216365 | A1 | * | 8/2010 | Song | 445/25 |

FOREIGN PATENT DOCUMENTS

| CN | 1358162 | 7/2002 |
| JP | 2002-324764 | 11/2002 |
| JP | 2003-282470 | 10/2003 |
| JP | 2005-206439 | 8/2005 |

OTHER PUBLICATIONS

English Translation of JP 2003-282470A.*
International Search Report issued in corresponding application No. PCT/JP2007/055236, completed Jun. 8, 2007 and mailed Jun. 19, 2007.
Chinese office action issued in corresponding application 2007800093432, issued Sep. 4, 2009.

* cited by examiner

*Primary Examiner* — Gregory A Wilson
(74) *Attorney, Agent, or Firm* — Griffin & Szipl, P.C.

(57) ABSTRACT

A heat shield plate for a substrate annealing apparatus is provided with a horizontally supported flat-plate-like substrate 1, a heater 5 positioned above the substrate to heat the upper surface of the substrate with radiation heat, and a heat shield plate 10 horizontally movable between a shielding position where the substrate is shielded from heater and an open position out of the shielding position. The heat shield plate 10 is composed of a structural member 12 made of a low thermal expansion material (carbon composite material) which is hardly deformed due to a temperature difference in the shielding position, and a heat insulating member 14 which covers the upper surface of the structural member and keeps the surface at an allowable temperature or below.

7 Claims, 3 Drawing Sheets

HEAT SHIELD PLATE FOR SUBSTRATE ANNEALING APPARATUS

This is a National Phase Application in the United States of International Patent Application No. PCT/JP2007/055236 filed Mar. 15, 2007, which claims priority on Japanese Patent Application No. 072201/2006, filed Mar. 16, 2006. The entire disclosures of the above patent applications are hereby incorporated by reference.

TECHNICAL FIELD

The present invention relates to a heat shield plate for a substrate annealing apparatus which carries a substrate, such as a glass substrate, into a heat-treating furnace, to anneal the substrate.

BACKGROUND ART

In a manufacturing process of a semiconductor device, like a lamp annealing apparatus or a CVD apparatus, an apparatus which heats and heat-treats substrates, for example, semiconductor wafers by carrying the wafers into a heat-treating furnace one by one, and irradiating the substrates with light is known (for example, Patent Document 1).

FIG. 1 is a schematic sectional view showing the schematic configuration of the conventional lamp annealing apparatus disclosed in Patent Document 1. In this drawing, reference numeral 50 represents a heat-treating furnace, reference numeral 52 represents a light incidence window, reference numeral 54 represents a wafer supporting ring, reference numeral 56 represents a wafer-supporting cylindrical holder, reference numeral 58 represents a lamp housing, reference numeral 60 represents a lamp, reference numeral 62 represents a reflector, and reference numeral 64 represents a shutter plate.

A semiconductor wafer W is carried into the heat-treating furnace 50 through an opening which is not shown, and is horizontally supported on the wafer supporting ring 54. The shutter plate 64 is supported so as to be movable in a horizontal direction by a supporting and moving mechanism which is not shown, and moves between an "actuated position" positioned between the light incidence window 52 and the lamp house 58, and a "retreat position" out of the actuated position. When heat treatment of the wafer W ends and supply of electric power to the lamp 60 stops, the shutter plate 64 moves at high speed from the retreat position to the actuated position, and shields the radiation of heat to the wafer W by the remaining heat immediately after turn-off of the lamp 60 so that the temperature of the wafer W may be rapidly dropped.

The above-mentioned shutter plate 64 is conventionally formed of, for example, a light-weight material, such as aluminum or titanium, so that it can be rapidly moved.
[Patent Document 1]
Japanese Unexamined Patent Application Publication No. 2003-282470 ("HEAT TREATMENT APPARATUS OF SUBSTRATE")

As described above, an apparatus (for example, rapid heating-cooling type substrate annealing apparatus) in which a heat shield plate is provided between a heater and a workpiece in order to rapidly heat or cool, for example, a glass substrate, etc., and the heat shield plate is moved to give the radiation of the heater to the workpiece or shield the radiation requires high heat resistance and mechanical strength, lightweight properties, etc.

Especially in the thermal resistance, one surface of the heat shield plate faces the heater, and the radiation of the heater radiation does not reach the other surface. Therefore, a large temperature difference may be caused between both the surfaces, and the heat shield plate may be deformed due to the temperature difference.

For example, in a case where a heater is used for rapid heating of a glass substrate, etc., the heater-side temperature becomes a high temperature (for example, around 750° C.) compared with a conventional technique. Therefore, since, for example, the temperature exceeds a melting point of aluminum, it cannot be used.

Further, in this actuated position, the substrate-side temperature is a medium temperature (for example, around 400° C.), and the temperature difference between both surfaces of the heat shield plate reaches about 350° C. or more. Thus, even in a case where titanium, etc. is used, large thermal deformation occurs.

Moreover, even in a case where a carbon material having a high heatproof temperature is used as a structure, the oxidation (burnout) of the carbon material caused by high temperature could not be avoided.

The invention has been invented in order to solve the above-mentioned problems.

That is, the object of the invention is to provide a heat shield plate for a substrate annealing apparatus which is small in thermal deformation, is not oxidized (burnout), is capable of increasing size and reducing weight, even in a case where one surface is exposed to a high temperature (for example, around 750° C.), the other surface is exposed to a temperature significantly lower than the high temperature, and a large temperature difference (for example, about 350° C. or more) is caused between both the surfaces.

DISCLOSURE OF THE INVENTION

Problems to be Solved by the Invention

According to the invention, a heat shield plate for a substrate annealing apparatus is provided with a horizontally supported flat-plate-like substrate, a heater positioned above the substrate to heat the upper surface of the substrate with radiation heat, and a heat shield plate horizontally movable between a shielding position where the substrate is shielded from heater and an open position out of the shielding position. The heat shield plate is composed of a structural member made of a low thermal expansion material which is hardly deformed due to a temperature difference in the shielding position, and a heat insulating member which covers the upper surface of the structural member and keeps the surface at an allowable temperature or below.

According to a preferable embodiment of the invention, the structural member is made of a composite carbon material (carbon composite material).

Further, the structural member has a plurality of horizontally extending beam members having bending rigidity required for the heat shield plate, a bottom plate constituting the lower surface of the heat shield plate, and coupling parts connecting the beam members and the bottom plate.

Further, the heat insulating member is composed of a sac-like outside heat insulator made of heat-resistant fabric cloth, and a fibrous inside heat insulator enclosed inside the outside heat insulator.

According to the above configuration of the invention, the structural member of the heat shield plate is made of a low thermal expansion material which is hardly deformed due to a temperature difference in the shielding position. Thus, even in a case where a large temperature difference (for example, about 350° C. or above) is caused between both surfaces, thermal deformation can be suppressed small.

Further, the heat insulating member which covers the upper surface of the structural member, and keeps the surface at an allowable temperature or below is provided. Thus, even if the upper surface is exposed to a high temperature (for example, around 750° C.), the structural member can be kept at an allowable temperature or below, and thereby the oxidation (burnout) thereof can be prevented.

Further, by forming the structural member from a composite carbon material (carbon composite material), the structural member can be made significantly lightweight as compared with a conventional metallic one.

Further, by composing the structural member of a plurality of horizontally extending beam members having bending rigidity required for the heat shield plate, a bottom plate constituting the lower surface of the heat shield plate, and coupling parts connecting the beam members and the bottom plate, the heat shield plate with a large area exceeding 1 m by 1 m can be easily configured using the small bottom plate whose enlargement is difficult.

Further, by composing the heat insulating member of a sac-like outside heat insulator made of heat-resistant fabric cloth, and a fibrous inside heat insulator enclosed inside the outside heat insulator, scattering of the fibrous inside heat insulator can be prevented by the sac-like outside heat insulator to keep the inside of the furnace clean.

BEST MODE FOR CARRYING OUT THE INVENTION

Figure 1:
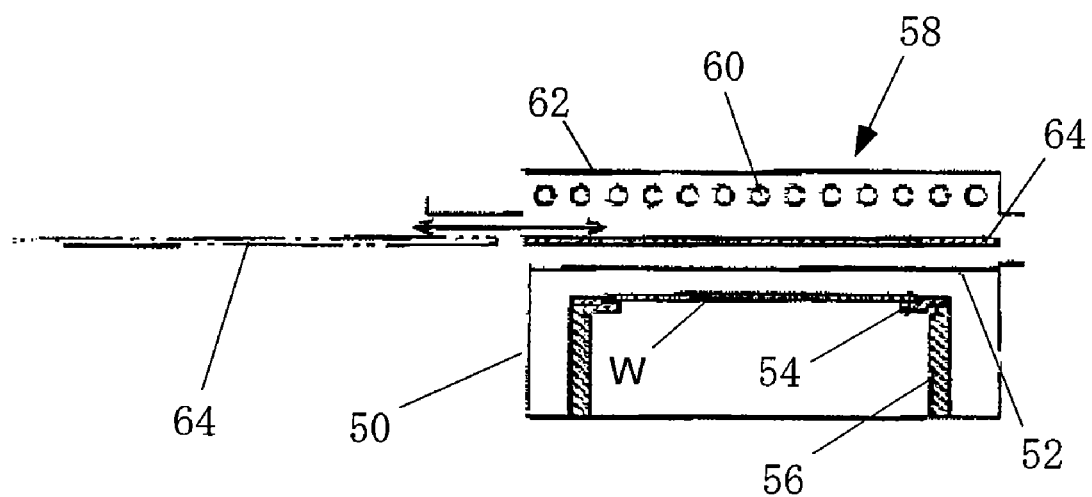
FIG. 1 is a schematic sectional view showing the schematic configuration of a conventional lamp annealing apparatus disclosed in Patent Document 1.

Hereinafter, a preferred embodiment of the invention will be explained with reference to the drawings. In addition, in each of the drawings, common portions are denoted by the same reference numerals, and duplicated description thereof is omitted.

Figure 2:
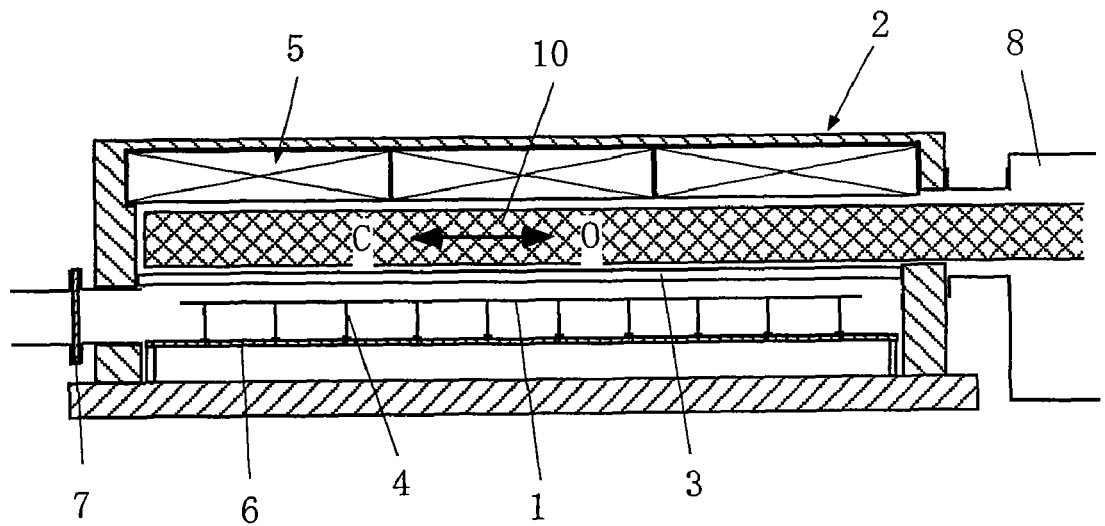
FIG. 2 is a view showing the entire configuration of a substrate annealing apparatus provided with a heat shield plate of the invention.

FIG. 2 is a view showing the entire configuration of a substrate annealing apparatus provided with a heat shield plate of the invention. In this drawing, reference numeral 2 represents a heat-treating furnace, reference numeral 3 represents a light incidence window, reference numeral 4 represents a substrate support member, reference numeral 5 represents a heater, reference numeral 6 represents a specular plate, reference numeral 7 represents a substrate entrance door, and reference numeral 10 represents a heat shield plate.

The flat-plate-like substrate 1 is, for example, a glass substrate, is carried into the heat-treating furnace 2 through the substrate entrance door 7 which can be opened and closed, and is horizontally supported on the substrate support member 4.

The heater 5 is, for example, an electric heater, a heat lamp, etc., and is positioned above the substrate 1 to heat the upper surface of the substrate 1 with radiation heat. In the heater 5, the heater-side temperature becomes high temperature (for example, around 750° C.), for example, for the rapid heating of the substrate 1.

The heat shield plate 10 is supported so as to be movable in a horizontal direction by a supporting and moving mechanism 8, and is configured so as to be horizontally movable between a shielding position (C direction in the drawing) which shields the substrate 1 from the heater 5, and an open position (O direction in the drawing) out of the shielding position.

By this configuration, when the heat treatment of the substrate 1 is completed, the heat shield plate 10 can be moved at high speed from the open position to the shielding position to shield the substrate from the heater, thereby rapidly dropping the temperature of the substrate 1.

Further, in this shielding position, the substrate-side temperature is a medium temperature (for example, around 400° C.), and the temperature difference between both surfaces of the heat shield plate 10 reaches about 350° C. or more.

Figure 3:
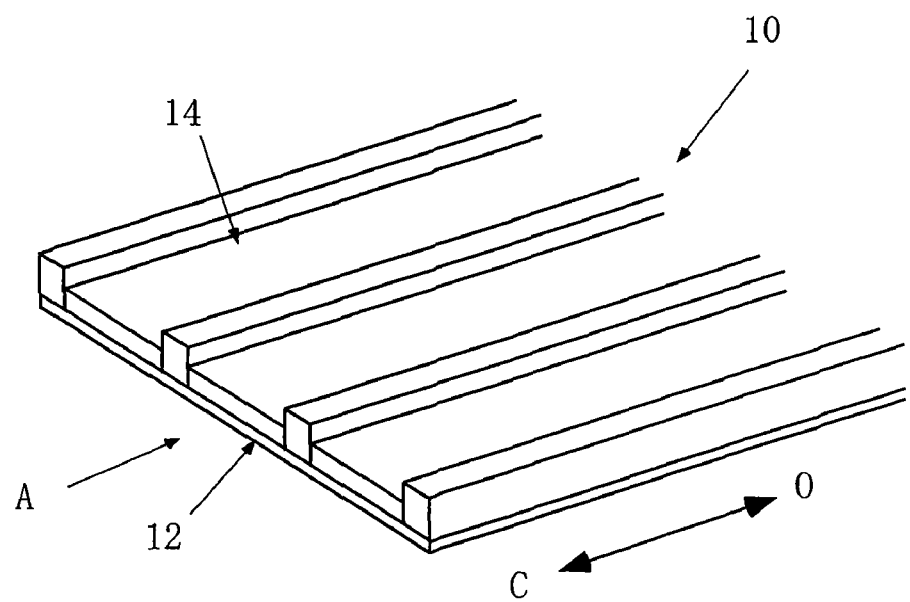
FIG. 3 is a perspective view of the heat shield plate of the invention.

FIG. 3 is a perspective view of the heat shield plate of the invention. In this drawing, the movement direction of the heat shield plate 10 is a C-O direction indicated by an arrow in the drawing.

In this drawing, the heat shield plate 10 of the invention is composed of a structural member 12 made of a low thermal expansion material which is hardly deformed due to a temperature difference in the shielding position, and a heat insulating member 14 which covers the upper surface of the structural member 12 and keeps the surface at an allowable temperature or below.

The structural member 12 may be a carbon composite material (composite carbon material), for example, a C/C composite material which has high-temperature oxidation-resistant coating.

The carbon composite material is a composite material of carbon fibers and a carbon matrix, and the thermal expansion coefficient thereof is about 3 to $4 \times 10^{-6}$/° C. (at 800K) close to the thermal expansion coefficient of carbon, and is ¼ to ⅕ or less of the thermal expansion coefficient of aluminum or iron.

Accordingly, even in a case where a large temperature difference (for example, about 350° C. or more) is caused between both surfaces (upper and lower surfaces) of the heat shield plate 10, thermal deformation can be suppressed small.

Figure 4:
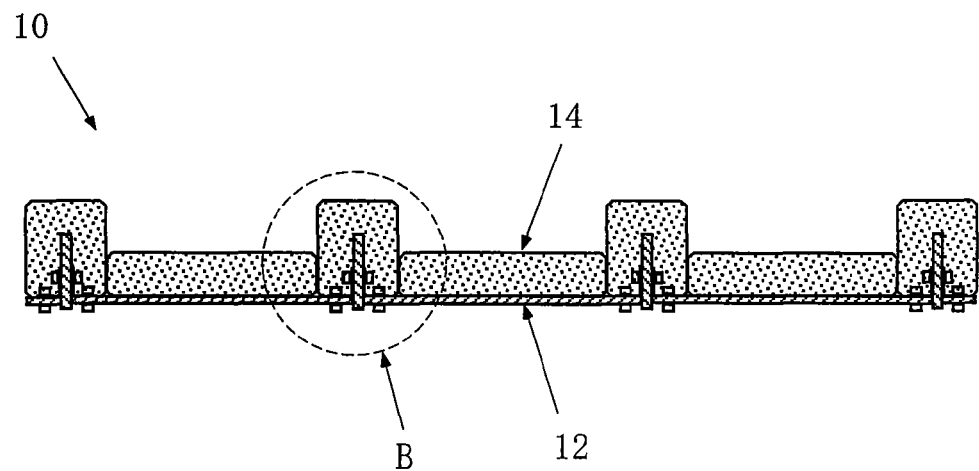
FIG. 4 is a view seen in the direction of an arrow A of FIG. 3.
Figure 5:
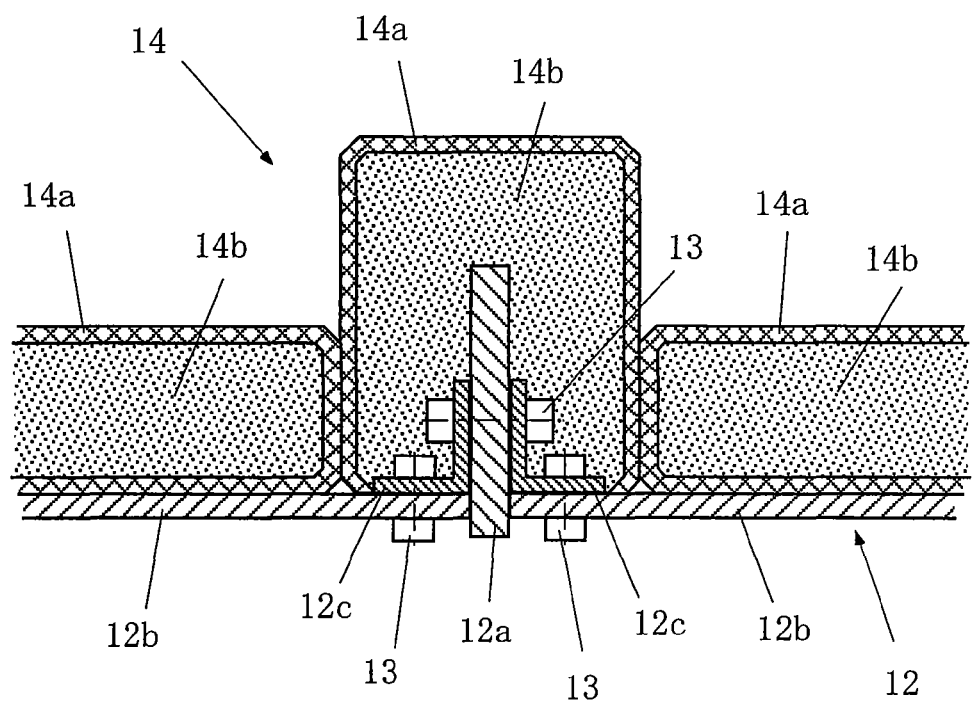
FIG. 5 is an enlarged view of a portion B of FIG. 4.

FIG. 4 is a view seen in the direction of an arrow A of FIG. 3, and FIG. 5 is an enlarged view of a portion B of FIG. 4.

As shown in FIGS. 4 and 5, in this embodiment, the structural member 12 has a plurality of (four in this embodiment) horizontally extending beam members 12a which have bending rigidity required for the heat shield plate, a bottom plate 12b which constitutes the lower surface of the heat shield plate, and coupling parts 12c which connect the beam members 12a and the bottom plate 12b.

Each of the beam members 12a is a flat plate made of a carbon composite material having particularly high burning resistance in this embodiment, extend in the C-O direction of FIG. 2, and is horizontally held as a whole while its portion on the O-side is supported by the supporting and moving mechanism 8. The beam member 12a has bending rigidity required for the heat shield plate, in a case where its end on the O-side is supported.

In addition, the invention is not limited to this configuration, but the beam member 12a may be shaped members other than a flat plate, for example, I-shaped, H-shaped, and L-shaped members. Further, the beam member 12a may be made of quartz, an SiC material, etc. other than the carbon composite material so long as it has burning resistance and thermal resistance.

Further, in other support forms where the beam member 12a does not have its end supported on the O side (for example, its both ends in a width direction are supported), the beam member may be configured so as to have bending rigidity suitable for the support forms.

The bottom plate 12b is a flat plate made of a plurality of (three in this embodiment) carbon composite materials, and is adapted to close gaps between the lower ends of the beam members 12a.

Each of the coupling parts 12c is an L-shaped member made of a carbon composite material in this embodiment, and it is positioned so as to adhere tightly to the side surfaces of the beam member 12a, and the upper surface of the bottom plate 12b.

In this embodiment, the structural member 12 further has a connecting member 13 (a bolt and a nut in this embodiment), and the coupling part 12c and the beam member 12a, and the coupling part 12c and the bottom plate 12b are firmly connected by the connecting member 13.

The connecting member 13 may be made of a heat-resistant metal, such as Incoloy, or a carbon material so as to endure an exposed temperature (around 400° C.).

By this configuration, the heat shield plate with a large area exceeding 1 m by 1 m can be easily configured using the small bottom plate 12b whose enlargement is difficult.

In addition, the invention is not limited to this configuration. The bottom plate 12b may be attached to the lower surface of the H-shaped or L-shaped beam member 12a by the connecting member 13, and the coupling part 12c may be omitted. Further, the whole may be constituted by one bottom plate 12b, and the beam member 12a may be attached thereon.

As shown in FIGS. 4 and 5, in this embodiment, the heat insulating member 14 is composed of a sac-like outside heat insulator 14a made of heat-resistant fabric cloth, and a fibrous inside heat insulator 14b enclosed inside the outside heat insulator 14a.

The sac-like outside heat insulator 14a is a heat-resistant fabric cloth, for example, a silica cloth, which is made of silica fibers, silica alumina fibers, etc., which have a thermal resistance of, for example, 750° C. or more.

The fibrous inside heat insulator 14b is silica wool which is made of silica fibers, silica alumina fibers, etc., which have a thermal resistance of, for example, 750° C. or more.

The inside heat insulator 14b, as shown in the drawing, may surround the beam member 12a so as to cover it, and the sac-like outside heat insulator 14a may surround this inside heat insulator so as to cover it. In addition, if required, the outside heat insulator 14a (silica cloth) may be sewn by threads made of silica fibers and silica alumina fibers so that the inside heat insulator 14b may not be exposed to the outside.

Further, as for the upper surface of the bottom plate 12b to be positioned between the beam members 12a, what is formed in advance in the shape of a cushion by the outside heat insulator 14a and the inside heat insulator 14b may be formed without a gap.

In addition, the invention is not limited to this configuration. The whole upper surface of the structural member 12 may be covered with the inside heat insulator 14b, and further, the circumference thereof may be surrounded by the outside heat insulator 14a. Further, the heat insulators may be surrounded and protected even at the side surfaces of the structural member as well as at the upper surface thereof.

By this configuration, scattering of the fibrous inside heat insulator 14b can be prevented by the sac-like outside heat insulator 14a to keep the inside of the furnace clean.

According to the configuration of the invention described above, the structural member 12 of the heat shield plate 10 is made of a low thermal expansion material (for example, carbon composite material) which is hardly deformed due to a temperature difference in the shielding position. Thus, even in a case where a large temperature difference (for example, about 350° C.) is caused between both surfaces, thermal deformation can be suppressed small, for example, to ¼ to ⅕ or below.

Further, the heat insulating member 14 which covers the upper surface of the structural member 12, and keeps the surface at an allowable temperature or below is provided. Thus, even if the upper surface is exposed to a high temperature (for example, around 750° C.), the structural member can be kept at an allowable temperature or below (for example, 450 to 500° C.), and thereby the oxidation (burnout) thereof can be prevented.

Accordingly, by adopting this structure, the shield plate of the invention can reduce shielding of the radiation heat of the heater, and the burnout speed of the carbon material itself, and can solve the problem of burnout of the structural member caused by deformation suppression by heat, and prolonged use.

In addition, it is natural that the invention is not limited to the above embodiment, but various modifications can be made without departing from the scope of the invention.

The invention claimed is:

1. A heat shield plate assembly for a substrate annealing apparatus, wherein the heat shield plate assembly comprises:
    (a) a horizontally supported flat-plate-like substrate;
    (b) a heater positioned above the substrate to heat an upper surface of the substrate with radiation heat; and
    (c) a heat shield plate horizontally movable between a shielding position where the substrate is shielded from the heater and an open position out of the shielding position,
    wherein the heat shield plate comprises a structural member made of a low thermal expansion material that has a thermal expansion coefficient of about $3 \times 10^{-6}/°$ C. to $4 \times 10^{-6}/°$ C. at 800° K, and a heat insulating member that covers an upper surface of the structural member and keeps the upper surface of the structural member at an allowable temperature or below thereby preventing burnout.

2. The heat shield plate assembly for a substrate annealing apparatus according to claim 1, wherein the structural member is made of a composite carbon material.

3. The heat shield plate assembly for a substrate annealing apparatus according to claim 2, wherein the heat insulating member comprises a sac-like outside heat insulator made of heat-resistant fabric cloth, and a fibrous inside heat insulator enclosed inside the outside heat insulator.

4. The heat shield plate assembly for a substrate annealing apparatus according to claim 1, wherein the structural member has a plurality of horizontally extending beam members, a bottom plate constituting a lower surface of the heat shield plate, and coupling parts connecting the beam members and the bottom plate.

5. The heat shield plate assembly for a substrate annealing apparatus according to claim 1, wherein the allowable temperature that prevents burnout is in the range of 450° C. to 500° C.

6. A heat shield plate assembly for a substrate annealing apparatus, wherein the heat shield plate assembly comprises:

(a) a horizontally supported flat-plate-like substrate;
(b) a heater positioned above the substrate to heat an upper surface of the substrate with radiation heat; and
(c) a heat shield plate horizontally movable between a shielding position where the substrate is shielded from the heater and an open position out of the shielding position,
wherein the heat shield plate comprises
    i. a structural member made of a low thermal expansion material that has a thermal expansion coefficient of about $3\times10^{-6}/°$ C. to $4\times10^{-6}/°$ C. at $800°$ K; and
    ii. a heat insulating member that covers an upper surface of the structural member and keeps the upper surface of the structural member at an allowable temperature or below thereby preventing burnout, and
    wherein the heat insulating member comprises a sac-like outside heat insulator made of heat-resistant fabric cloth, and a fibrous inside heat insulator enclosed inside the outside heat insulator.

7. The heat shield plate assembly for a substrate annealing apparatus according to claim 6, wherein the allowable temperature that prevents burnout is in the range of $450°$ C. to $500°$ C.

* * * * *